(12) United States Patent
Chini et al.

(10) Patent No.: US 9,496,353 B2
(45) Date of Patent: Nov. 15, 2016

(54) FABRICATION OF SINGLE OR MULTIPLE GATE FIELD PLATES

(75) Inventors: Alessandro Chini, Modena (IT); Umesh K. Mishra, Montecito, CA (US); Primit Parikh, Goleta, CA (US); Yifeng Wu, Goleta, CA (US)

(73) Assignees: The Regents of the University of California, Oakland, CA (US); Cree, Inc., Durham, NC (US)

( * ) Notice: Subject to any disclaimer, the term of this patent is extended or adjusted under 35 U.S.C. 154(b) by 0 days.

(21) Appl. No.: 12/898,341

(22) Filed: Oct. 5, 2010

(65) Prior Publication Data

US 2011/0018062 A1 Jan. 27, 2011

Related U.S. Application Data

(62) Division of application No. 10/570,964, filed as application No. PCT/US2004/029324 on Sep. 9, 2004, now Pat. No. 7,812,369.

(60) Provisional application No. 60/501,557, filed on Sep. 9, 2003.

(51) Int. Cl.
*H01L 29/40* (2006.01)
*H01L 27/06* (2006.01)
(Continued)

(52) U.S. Cl.
CPC ......... *H01L 29/402* (2013.01); *H01L 27/0605* (2013.01); *H01L 29/404* (2013.01); *H01L 29/42312* (2013.01); *H01L 29/66462* (2013.01); *H01L 29/7787* (2013.01); *H01L 29/2003* (2013.01); *H01L 29/207* (2013.01); *H01L 29/41766* (2013.01); *H01L 29/42316* (2013.01); *H01L 29/785* (2013.01)

(58) Field of Classification Search
None
See application file for complete search history.

(56) References Cited

U.S. PATENT DOCUMENTS

| 4,999,682 A | 3/1991 | Xu et al. |
| 5,192,987 A | 3/1993 | Khan et al. |

(Continued)

FOREIGN PATENT DOCUMENTS

| JP | 4-162633 | 6/1992 |
| JP | 9-219512 | 8/1997 |

(Continued)

OTHER PUBLICATIONS

EP Examination Report dated Nov. 4, 2010 (EP application No. 04788636.1).

(Continued)

*Primary Examiner* — Benjamin Sandvik
(74) *Attorney, Agent, or Firm* — Gates & Cooper LLP

(57) ABSTRACT

A process for fabricating single or multiple gate field plates using consecutive steps of dielectric material deposition/growth, dielectric material etch and metal evaporation on the surface of a field effect transistors. This fabrication process permits a tight control on the field plate operation since dielectric material deposition/growth is typically a well controllable process. Moreover, the dielectric material deposited on the device surface does not need to be removed from the device intrinsic regions: this essentially enables the realization of field-plated devices without the need of low-damage dielectric material dry/wet etches. Using multiple gate field plates also reduces gate resistance by multiple connections, thus improving performances of large periphery and/or sub-micron gate devices.

36 Claims, 4 Drawing Sheets

(51) Int. Cl.

| | | |
|---|---|---|
| *H01L 29/423* | (2006.01) | |
| *H01L 29/66* | (2006.01) | |
| *H01L 29/778* | (2006.01) | |
| *H01L 29/20* | (2006.01) | |
| *H01L 29/207* | (2006.01) | |
| *H01L 29/417* | (2006.01) | |
| *H01L 29/78* | (2006.01) | |

(56) References Cited

U.S. PATENT DOCUMENTS

| | | | |
|---|---|---|---|
| 5,290,393 | A | 3/1994 | Nakamura |
| 5,296,395 | A | 3/1994 | Khan et al. |
| 5,302,840 | A * | 4/1994 | Takikawa ............ 257/194 |
| 5,393,993 | A | 2/1995 | Edmond et al. |
| 5,523,589 | A | 6/1996 | Edmond et al. |
| 5,686,738 | A | 11/1997 | Moustakas |
| 5,739,554 | A | 4/1998 | Edmond et al. |
| 5,831,320 | A | 11/1998 | Kwon et al. |
| 5,872,369 | A | 2/1999 | Inokuchi |
| 5,949,095 | A * | 9/1999 | Nagahara ............ H01L 29/475 257/192 |
| 6,100,571 | A * | 8/2000 | Mizuta et al. ............ 257/488 |
| 6,294,801 | B1 * | 9/2001 | Inokuchi et al. ........... 257/192 |
| 6,316,793 | B1 | 11/2001 | Sheppard et al. |
| 6,316,820 | B1 | 11/2001 | Schmitz et al. |
| 6,445,038 | B1 | 9/2002 | Tihanyi |
| 6,465,814 | B2 | 10/2002 | Kasahara et al. |
| 6,483,135 | B1 | 11/2002 | Mizuta et al. |
| 6,548,333 | B2 | 4/2003 | Smith |
| 6,559,513 | B1 * | 5/2003 | Miller et al. ............ 257/488 |
| 6,586,781 | B2 | 7/2003 | Wu et al. |
| 6,586,813 | B2 | 7/2003 | Nagahara |
| 6,740,535 | B2 | 5/2004 | Singh et al. |
| 6,933,544 | B2 | 8/2005 | Saito et al. |
| 7,126,426 | B2 | 10/2006 | Mishra et al. |
| 2001/0023964 | A1 * | 9/2001 | Wu et al. ............ 257/368 |
| 2002/0005528 | A1 * | 1/2002 | Nagahara ............ 257/189 |
| 2002/0017648 | A1 * | 2/2002 | Kasahara et al. ............ 257/79 |
| 2002/0043697 | A1 * | 4/2002 | Hirokawa et al. .......... 257/472 |
| 2002/0052076 | A1 | 5/2002 | Khan et al. |
| 2002/0145172 | A1 | 10/2002 | Fujishima et al. |
| 2002/0167023 | A1 | 11/2002 | Chavarkar et al. |
| 2002/0171096 | A1 * | 11/2002 | Wakejima et al. ........... 257/280 |
| 2003/0006437 | A1 | 1/2003 | Mizuta et al. |
| 2003/0020092 | A1 | 1/2003 | Parikh et al. |
| 2003/0102482 | A1 | 6/2003 | Saxler |
| 2003/0136986 | A1 | 7/2003 | ElMasry et al. |
| 2003/0183844 | A1 * | 10/2003 | Yokoyama .......... H01L 29/0619 257/192 |
| 2003/0235974 | A1 * | 12/2003 | Martinez .......... H01L 21/28587 438/555 |
| 2005/0001234 | A1 | 1/2005 | Inoue et al. |

FOREIGN PATENT DOCUMENTS

| | | |
|---|---|---|
| JP | 09-232827 | 9/1997 |
| JP | 2000-003919 | 1/2000 |
| JP | 2000100831 | 4/2000 |
| JP | 2000-315804 | 11/2000 |
| JP | 2001085670 | 3/2001 |
| JP | 2001-230263 | 8/2001 |
| JP | 2001-230407 | 8/2001 |
| JP | 2001-237250 | 8/2001 |
| JP | 2002-016245 | 1/2002 |
| JP | 2002-100642 | 4/2002 |
| JP | 2002118122 | 4/2002 |
| JP | 2002-270830 | 9/2002 |
| JP | 2002-343814 | 11/2002 |
| JP | 200359948 | 2/2003 |
| JP | 2003-100778 | 4/2003 |
| TW | 373247 | 11/1999 |
| TW | 399321 | 7/2000 |
| TW | 511190 | 11/2002 |
| TW | 517260 | 1/2003 |
| WO | 02/093650 | 11/2002 |
| WO | 03050849 | 6/2003 |

OTHER PUBLICATIONS

JP Office Action dated Apr. 19, 2011 (Application No. 2006-525544) with translation.

KR Office Action, Application No. 10-2006-7004893, dated Mar. 29, 2011, with translation.

TW Office Action dated Apr. 29, 2011 (TW Application No. 093127327) with translation.

Supplementary European Search Report dated Jul. 28, 2010, Application No. EP 04788636.

Taiwan Office Action with Search Report dated Oct. 26, 2012, with English translation, Application No. 100142118.

Ando et al., "10-W/mm AlGaN-GaN HFET With a Field Modulating Plate", IEEE Electron Device Letters, vol. 24, No. 5, pp. 289-291, May 2003.

Asano et al., "Novel High Power AlGaAs/GaAs HFET with a Field-Modulating Plate Operated at 35V Drain Voltage", 1998 International Electron Devices Meeting, Technical Digest, pp. 59-62.

Dorf, "The Electrical Engineering Handbook", Second Edition, CRC Press, IEEE Press, 1997.

Eastman et al., "GaN Materials for High Power Microwave Amplifiers", Mnt, Res. Soc. Symp. Proc. vol. 512, 1996 Materials Research Society.

Gaska et al., "Electron transport in AlGaN-GaN heterostructures grown on 6H-SiC substrates", 1998 American Institute of Physics, vol. 72, No. 6, pp. 707-709.

Gaska et al., "High-Temperature Performance of AlGaN/GaN HFET's on SiC Substrates", IEEE Electron Device Leters, vol. 18, No. 10, Oct. 1997, pp. 492-494.

Gelmont et al., "Monte Carlo Simulation of Electron Transport in Gallium Nitride", 1983 American Institute of Physics, vol. 74, No. 3, pp. 1818-1821.

Karmalkar et al., "Very high voltage AlGaN/GaN high electron mobility transistors using a field plate deposited on a stepped insulator", 2001 Elsevier Science Ltd., Solid-State Electronics 45 (2001) pp. 1645-1652.

Li, "High Breakdown Voltage GaN HFET with Field Plate," Electronic Letters, Feb. 1, 2001, vol. 37, No. 3, pp. 196-197.

Micovic et al, "AlGaN/GaN Heterojunction Field Effect Transistors Grown by Nitrogen Plasma Assisted Molecular Beam Epitaxy", IEEE Transactions on Electron Devices, vol. 48, No. 3, Mar. 2001, pp. 591-596.

Ping et al., "DC and Microwave Performance of High-Current AlGaN/GaN Heterostructure Field Effect Transistors Grown on p-Type Sic Substrates",IEEE Electron Device Letters, vol. 19, No. 2, Feb. 1998, pp. 54-56.

Saito et al., "600V AlGaN/GaN Power-HEMT: Design, Fabrication and Demonstration on High Voltage DC-DC Converter", IEDM 03-587, 2003 IEEE, pp. 23.7.1-23.7.4.

Sullivan et al., "High-power 10 GHz Operation of AlGaN HFET's on Insulating SiC", IEEE Electron Device Letters, vol. 19, No. 6, Jun. 1998.

Wu et al., "High-gain Microwave GaN HEMTs with Source-terminated Field-plates", Cree Santa Barbara Technology Center, Goleta, CA *two pgs*.

Wu et al., "30-W/mm GaN HEMTs by Field Plate Optimization", IEEE Electron Device Letters, vol. 25, No. 3, 2004, *pp. 117-119*.

Wu et al., "High Al-Content AlGaN/GaN MODFET's for Ultrahigh Performance", IEEE Electron Device Letters, vol. 19, No. 2, Feb. 1998, pp. 50-53.

Wu et al., "Very-High Power Density AlGaN/GaN HEMTs", IEEE Transactions on Electronic Devices, vol. 48, No. 3, Mar. 2001, pp. 586-590.

Wu et al., "GaN-Based FETs for Microwave Power Amplification", IEICE Trans. Electron., vol. E82-C, No. 11, Nov. 1999, pp. 1895-1905.

(56) References Cited

OTHER PUBLICATIONS

Chinese Office Action issued May 16, 2008, Application No. 200480025976.9.
Extended European Search Report dated Apr. 16, 2013 for European Patent Application No. 12192425.2.
Canadian Office Action dated Aug. 1, 2012, Application No. 2,538,077.
Japanese Office Action dated Dec. 15, 2011, Application No. 2006-525544, with translation.
Japanese Rejection of Appeal dated Feb. 19, 2013 for Japanese Patent Application No. 2006-525544.
Japanese Office Action (with English translation) dated Oct. 30, 2013 for Japanese Patent Application No. 2012-081726.
Japanese Office Action dated Aug. 27, 2013 for JP application No. 2011-229873.
Canadian Office Action dated Sep. 4, 2013 for Canadian Patent Application No. 2,538,077.
Japanese Office Action (with English translation) dated Jul. 3, 2014 for Japanese Patent Application No. 2011-229873.
Japanese Office Action (with English translation) dated Nov. 19, 2014 for Japanese Patent Application No. 2012-081726.
Mok, Philip K.T., et al., "A Novel High-Voltage High-Speed MESFET Using a Standard GaAs Digital IC Process", IEEE Transactions on Electron Devices, Feb. 1994, pp. 246-250, vol. 41, No. 2.
Japanese Office Action (with English translation) and Denial of Entry of Amendment (with English translation) dated Dec. 18, 2014 for Japanese Patent Application No. 2011-229873.
Smith, S.A., "High rate and selective etching of GaN, AlGaN, and AlN using an inductively coupled plasma", Appl. Phys. Lett., Dec. 22, 1997, pp. 3631-3633, vol. 71, No. 25.
Adesida, I., et al., "Characteristics of chemically assisted ion beam etching of gallium nitride", Appl. Phys. Lett., Aug. 15, 1994, pp. 889-891, vol. 65, No. 7.
http://www.mems-exchange.org/catalog/P2452/, Ion Milling: View.
European Examination Report dated Mar. 9, 2015 for European Patent Application No. 04788636.1.
Japanese Office Action (with English Translation) dated Jun. 1, 2015 for Japanese Patent Application No. 2011-229873.
European Examination Report dated Nov. 6, 2015 for European Patent Application No. 04788636.1.
EPO Communication dated Jul. 13, 2016 for EP application No. 04788636.1.

\* cited by examiner

FABRICATION OF SINGLE OR MULTIPLE GATE FIELD PLATES

CROSS-REFERENCE TO RELATED APPLICATIONS

This application is a divisional under 35 U.S.C. §121 of commonly-assigned U.S. Utility patent application Ser. No. 10/570,964, entitled "FABRICATION OF SINGLE OR MULTIPLE GATE FIELD PLATES," filed on Mar. 8, 2006, by Alessandro Chini, Umesh K. Mishra, Primit Parikh, and Yifeng Wu, which application claims the benefit under 35 U.S.C. §365 of commonly-assigned PCT Internation Patent Application Serial No. PCT/US04/029324, entitled "FABRICATION OF SINGLE OR MULTIPLE GATE FIELD PLATES," filed on Sep. 9, 2004, by Alessandro Chini, Umesh K. Mishra, Primit Parikh, and Yifeng Wu, which application claims the benefit under 35 U.S.C. §119(e) of commonly-assigned U.S. Provisional Patent Application Ser. No. 60/501,557, entitled "FABRICATION OF SINGLE OR MULTIPLE GATE FIELD PLATES," filed on Sep. 9, 2003, by Alessandro Chini, Umesh K. Mishra, Primit Parikh, and Yifeng Wu, all of which applications are incorporated by reference herein.

STATEMENT REGARDING FEDERALLY SPONSORED RESEARCH AND DEVELOPMENT

This invention was made with Government support under Grant No. N00014-01-1-0764 awarded by the ONR MURI program and Grant No. F49620-99-1-0296 awarded by the AFOSR MURI program. The Government has certain rights in this invention.

BACKGROUND OF THE INVENTION

1. Field of the Invention

This invention relates to semiconductor devices, and more particularly, to the fabrication of single or multiple gate field plates.

2. Description of the Related Art (Note: This application references to various publications as indicated in the specification by reference numbers enclosed in brackets, e.g., [x]. A list of these publications ordered according to these reference numbers can be found below in the section entitled "References." Each of these publications is incorporated by reference herein.)

In a semiconductor-based field effect transistor (FET), a large electric field arises during normal operation in the gate-drain access region. Field plating is a well-known technique for improving device performance under high electric field operation as well as alleviating surface traps phenomena [1], [2]. For example, field plating has been an effective and well-known technique in order to alleviate all the detrimental effects (breakdown voltages, trapping effects, reliability) that take places in devices operating at high electric field.

The basic concept of field plating relies on the vertical depletion of the device active region, thus enabling larger extensions of the horizontal depletion region. This results in a lower electric field in the device active region for a given bias voltage, alleviating all the detrimental effects (low breakdown, trapping phenomena, poor reliability) that take place whenever a device is operated at a high electric field. Moreover, a field plate positioned in the gate drain access region has also the capability of modulating the device active region, resulting in a decrease of surface traps effects that prevent proper device operation under large radio frequency (RF) signals What is needed, however, are improved methods of fabricating single or multiple gate field plates as well as improved structures incorporating single or multiple gate field plates.

SUMMARY OF THE INVENTION

Embodiments of the present invention provide improved methods of fabricating single and multiple gate field plates. A fabrication process according to the invention uses consecutive steps of dielectric material deposition or growth, dielectric material etch and metal evaporation on the surface of field effect transistors. The advantages of the fabrication process include tight control of the dielectric material thickness, and the absence of any exposure of the surface of the device active region to any dry or wet etch process that may induce damage in the semiconductor material forming the field effect transistor. Moreover, the dielectric material deposited on the device surface does not need to be removed from the device intrinsic regions, which enables the realization of field-plated devices without damage caused by the dry or wet etch processes. Using multiple gate field plates reduces gate resistance through the use of multiple connections, thus improving performances of large periphery and/or sub-micron gate devices. Finally, by properly adjusting the thickness of the dielectric material, parallel gate contacts can be deposited on top of the dielectric material, in order to significantly reduce gate resistance by electrically connecting the parallel gate contacts on device extrinsic regions.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes a simple fabrication process for the realization of single or multiple gate field plate structures for field effect transistors (FETs). The present invention uses simple and typically well-controlled consecutive processing steps of dielectric material deposition or growth, dielectric material etch and metal evaporation.

Fabrication Process

FIGS. 1A, 1B, 2A, 2B, 3A, 3C, 4A, and 4B illustrate the steps of one possible realization of the fabrication process according an embodiment of the invention, wherein the fabrication process comprises a method of fabricating gate field plates.

Figure 1A:
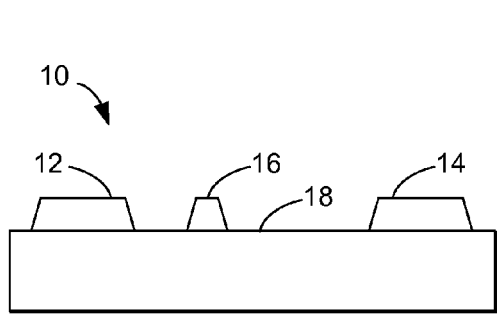
FIG. 1A is a cross-sectional and FIG. 1B is a top view of a field effect transistor (FET)
Figure 1B:
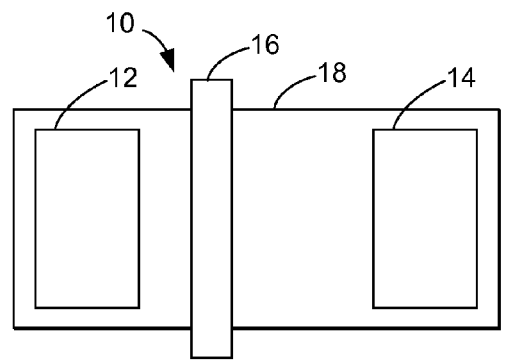

FIG. 1A is a cross-sectional and FIG. 1B is a top view of a field effect transistor (FET) 10 that includes source and drain ohmic contacts 12 and 14, a gate contact 16 and an active region 18. The steps of the fabrication process are applied on the field effect transistor 10 or other device. The method generally comprises performing consecutive steps of dielectric material deposition or growth, dielectric material etch and metal evaporation to create one or more field plates on a surface of the device, wherein the steps permit a tight control on field plate operation and wherein the dielectric material deposited on the surface does not need to be removed from the active region 18, thereby enabling realization of a field-plated device without using a low-damage dielectric material dry or wet etch process. The performing step further comprises the steps of: (1) depositing or growing the dielectric material on the intrinsic and extrinsic regions of the device, wherein the dielectric material thickness is controlled in order to achieve proper operation of the device; (2) patterning the dielectric material by the dry or wet etch process or by a lift-off process, so that the dielectric material remains principally on an active region of the device; and (3) evaporating a field plate on the patterned dielectric material, wherein gate and field plate contacts are electrically shorted at least at one side of the extrinsic region, providing a low resistance connection therebetween. These steps are described in more detail below in conjunction with FIGS. 2A, 2B, 3A, 3B, 4A and 4B.

Figure 2A:
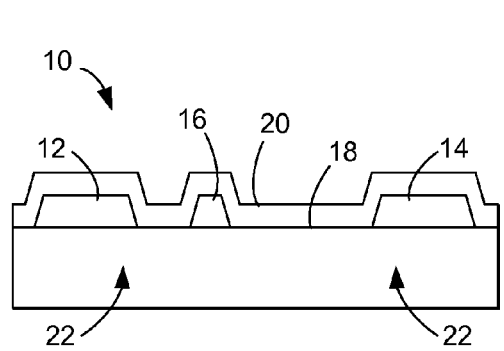
FIG. 2A is a device cross-section and FIG. 2B is a device top view illustrating dielectric material deposition/growth.
Figure 2B:
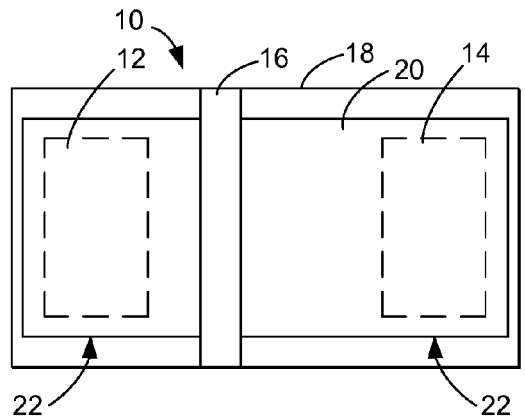

FIG. 2A is a device cross-section and FIG. 2B is a device top view illustrating the first step of the fabrication process, which comprises depositing or growing the dielectric material 20 on intrinsic and extrinsic regions of the device 10. The dielectric material 20 thickness is the critical parameter to be controlled in order to achieve proper operation of the finished device 10. However, this is usually a well controlled process in most deposition/growth techniques, e.g., PECVD (Plasma Enhanced Chemical Vapor Deposition). Typical materials are silicon nitrides and oxides, but others can be used, as long as they can be patterned by dry or wet etching or by lift-off.

Figure 3A:
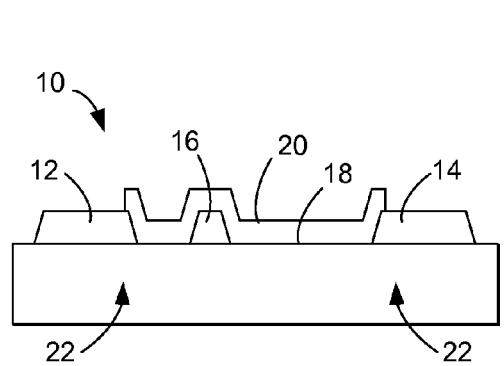
FIG. 3A is a device cross-section and FIG. 3B is a device top view illustrating dielectric material being removed from device extrinsic regions.
Figure 3B:
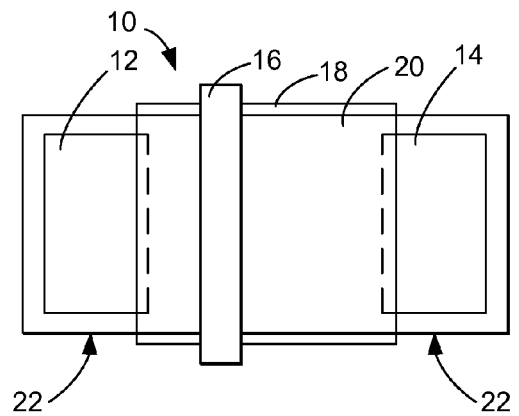

FIG. 3A is a device cross-section and FIG. 3B is a device top view illustrating the second step of the fabrication process, which comprises patterning the dielectric material 20, by etch or removal from device extrinsic regions 22, so that the dielectric material 20 remains principally on an active region 18 of the device 10. In the case where the pattern is formed by etching, it should be stressed that the device 10 surface will be protected during this step, preventing any exposure of the surface of the active region 18 to any dry or wet etch process that may induce damage in the semiconductor material forming the device. After this step, ohmic contacts 12, 14 are electrically accessible, as well as the gate portion 16 that resides in the device extrinsic region 22.

Figure 4A:
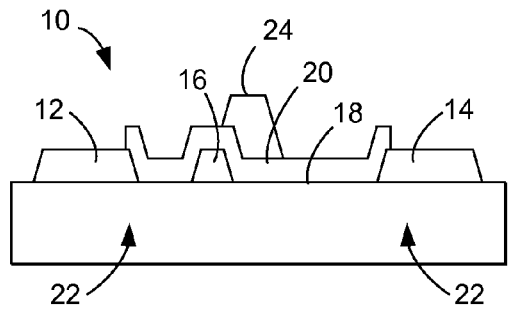
FIG. 4A is a device cross-section and FIG. 4B is a device top view illustrating evaporation of gate field plate.
Figure 4B:
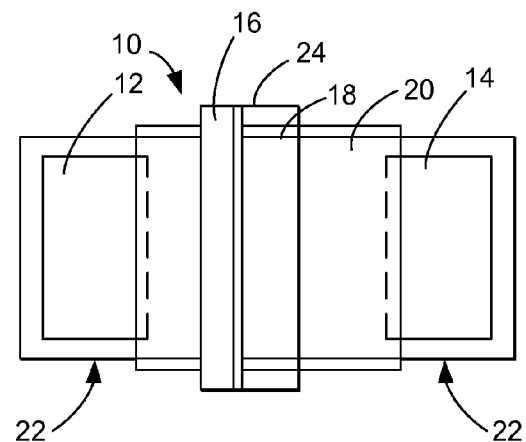

FIG. 4A is a device cross-section and FIG. 4B is a device top view illustrating the third step of the fabrication process, which comprises creating a field plate 24 on the patterned dielectric material 20, wherein gate 16 and field plate 24 contacts are electrically shorted at least at one side of the extrinsic region, providing a low resistance connection therebetween. Preferably, metal evaporation is used to form the field plate 24, wherein the field plate 24 comprised of a metal stripe or contact. The field plate 24 is positioned in a gate 16 drain access region, thereby providing a capability of modulating the active region 18, resulting in a decrease of surface traps effect that prevent proper device operation under large RF signals. The field plate 24 is connected to both sides of the device intrinsic region, and the gate 16 and field plate 24 are electrically shorted at least at one side of the extrinsic region 22, providing a low resistance connection between the two metal lines thereof. The offset and length of the field plate 24 are optimized with respect to the targeted device performance, i.e., breakdown voltage, RF performance, etc.

If a multiple field plate structure is required, the three steps of dielectric material deposition/growth, dielectric material etch and metal evaporation described in FIGS. 2A, 2B, 3A, 3B, 4A and 4B can be repeated.

Figure 5A:
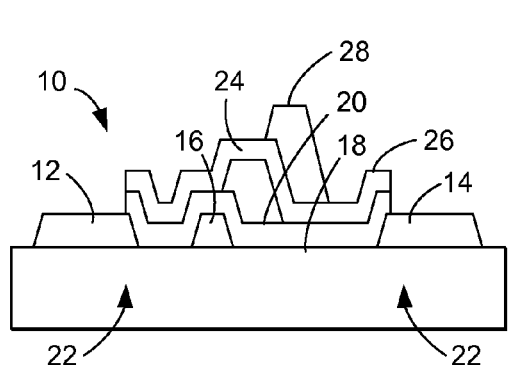
FIG. 5A is a device cross-section and FIG. 5B is a device top view illustrating an example of multiple field plate structure.
Figure 5B:
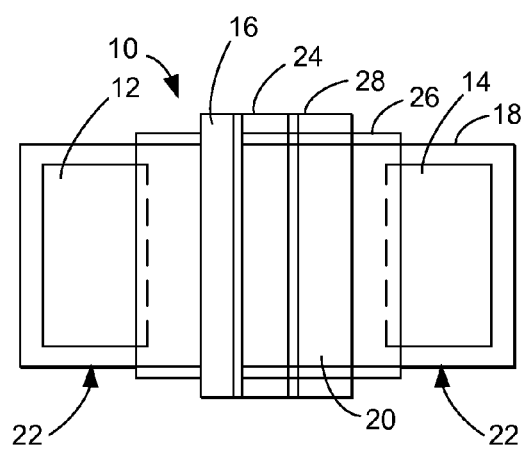

FIG. 5A is a device cross-section and FIG. 5B is a device top view illustrating an example of creating multiple connections using multiple gate field plates in order to reduce gate resistance, thereby improving the performance of a large periphery device and/or sub-micron gate device. This example is a two field plate structure, which includes another layer of dielectric material 26 and another field plate 28 comprised of a metal stripe or contact. Dielectric material 26 thickness, field plate 28 length and offset with respect to the gate 16 and other field plates 24, and the number of field plates 24, 28 introduced, comprise fabrication process parameters. Using multiple field plates 24, 28 allows more freedom in device 10 design, and has a significant impact in the realization of high voltage devices 10.

Another advantage of the present invention is the possibility of alleviating the decrease in RF performance induced by gate resistance in a large periphery device. Typically, the frequency of maximum oscillation ($f_{max}$) decreases at the increasing of the gate finger width due to the increase in gate resistance.

Figure 6:
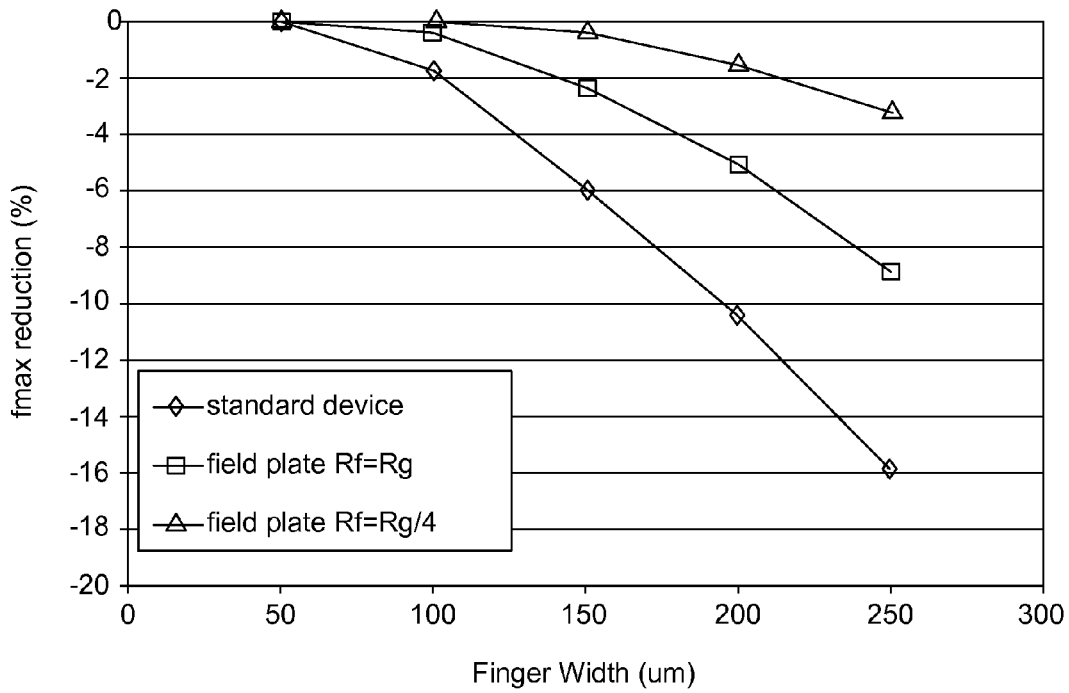
FIG. 6 is a graph of simulation of $f_{max}$ dependence vs. gate finger width.

FIG. 6 is a graph of simulation of $f_{max}$ dependence vs. gate finger width. As indicated in the graph, the introduction of a field plate structure shorted on both ends of the active region can improve $f_{max}$ performances of devices with large finger width. Using a field plate with a resistance Rf equivalent to the gate resistance Rg and connected to both sides of the active region significantly improves $f_{max}$ performance. Further improvement can be achieved by lowering field plate resistance. It should be stressed that this decrease will be observed only if the parasitic capacitances added by the field plate structure are negligible compared to those of the intrinsic device. This can be achieved by proper choice of dielectric material and its thickness, and has to be considered as an optimization process.

Multiple connections between the gate and field plate also results in a significant decrease in the gate resistance. In order to achieve this multiple connection without severely degrading RF operation, a small portion of the active region is etched prior to gate deposition to create the multiple connections between the gate and the field plates without degrading the device's RF operation.

In this region, the gate and field plates can be connected without introducing any additional parasitic capacitance to the device. Again, device performance improves only if the introduced parasitic capacitance is small as compared to those of the intrinsic device. Furthermore, the spacing between individual active regions is used to engineer the thermal impedance of the device more effectively than a device with a conventional topology.

Critical parameters are the choice of dielectric material, the thickness of the dielectric material, and the length of the field plates. These critical parameters have to be considered as optimization steps of the proposed fabrication process.

Using this method allows the fabrication of large periphery devices with a reduced number of air bridges. Moreover, the fabrication of sub-micron devices can take advantage of the present invention. Typically, sub-micron gates are fabricated using a T-shape process, since the T-shape reduces gate resistance as compared to a standard gate shape. Low gate resistance can be achieved even with sub-micron gates by creating the multiple connections without a T-shape process.

In addition, a parallel gate contact can be deposited on top of the dielectric material by properly adjusting the material dielectric thickness, in order to significantly reduce gate resistance by creating multiple connections using the parallel field plates on the device extrinsic regions. The low resistance path is provided by the parallel field plates, through a proper choice of the width at which the connection between the gate and field plates occurs.

Figures 7A, 7B:
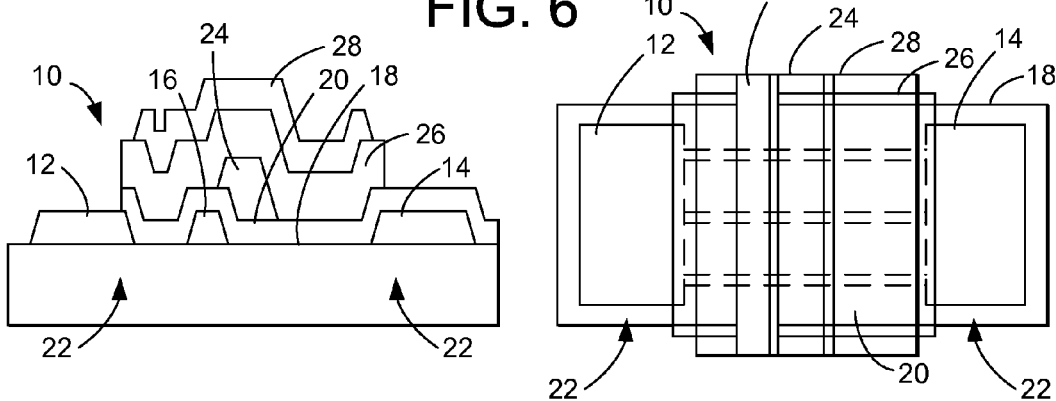
FIG. 7A is a device cross-section.
FIG. 7B is a device top view and FIG. 7C is a device cross-section illustrating a multiple field plate device for reduced gate resistance.
Figure 7C:
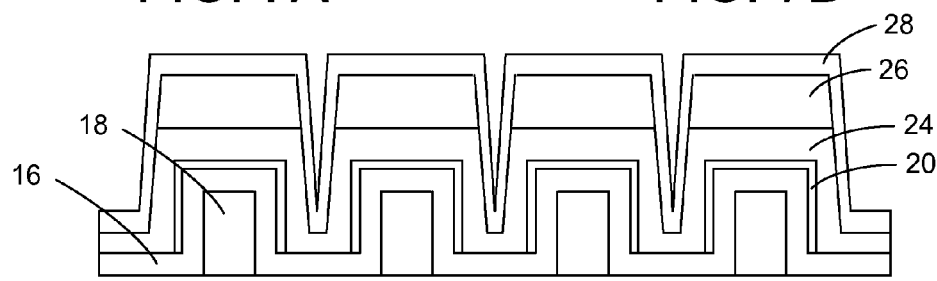

FIG. 7A is a device cross-section, FIG. 7B is a device top view and FIG. 7C is a device cross-section illustrating examples of multiple field plate structures for reduced gate resistance. Moreover, having a field plate covering the gate source access region, such as shown in FIGS. 7A, 7B and 7C, is also used for of modulating source access resistance for improving device linearity performance.

Gallium Nitride-Based High Electron Mobility Transistor with Field Plates

GaN based transistors including AlGaN/GaN High Electron Mobility Transistors (HEMTs) are capable of very high voltage and high power operation at RF, microwave and millimeter-wave frequencies. However, electron trapping and the ensuing difference between DC and RF characteristics has limited the performance of these devices. SiN passivation has been successfully employed to alleviate this trapping problem, resulting in high performance devices with power densities over 10 W/mm at 10 GHz. For example, [3] discloses methods and structures for reducing the trapping effect in GaN transistors. However, due to the high electric fields existing in these structures, charge trapping is still an issue.

The present invention has been successfully utilized for improving the performance of AlGaN/GaN HEMT power devices. At 4 GHz operation, power densities of 12 W/mm and 18.8 W/mm have been achieved for devices on sapphire and silicon carbide substrate, respectively. Due to the simplicity of the processing step involved in the field plate fabrication, the present invention can be used in the development of AlGaN/GaN HEMTs technology and other semiconductor devices. Using properly designed multiple field plates greatly improves both breakdown and large RF signal performance in such devices.

A GaN-based HEMT includes a channel layer and a barrier layer on the channel layer. Metal source and drain ohmic contacts are formed in contact with the barrier layer. A gate contact is formed on the barrier layer between the source and drain contacts and a spacer layer is formed above the barrier layer. The spacer layer may be formed before or after formation of the gate contact. The spacer layer may comprise a dielectric layer, a layer of undoped or depleted $Al_xGa_{1-x}N$ ($0<=x<=1$) material, or a combination thereof. A conductive field plate is formed above the spacer layer and extends a distance Lf (field plate distance) from the edge of the gate contact towards the drain contact. The field plate may be electrically connected to the gate contact. In some embodiments, the field plate is formed during the same deposition step as an extension of the gate contact. In other embodiments, the field plate and gate contact are formed during separate deposition steps. This arrangement may reduce the peak electric field in the device resulting in increased breakdown voltage and reduced trapping. The reduction of the electric field may also yield other benefits such as reduced leakage currents and enhanced reliability.

Figure 8:
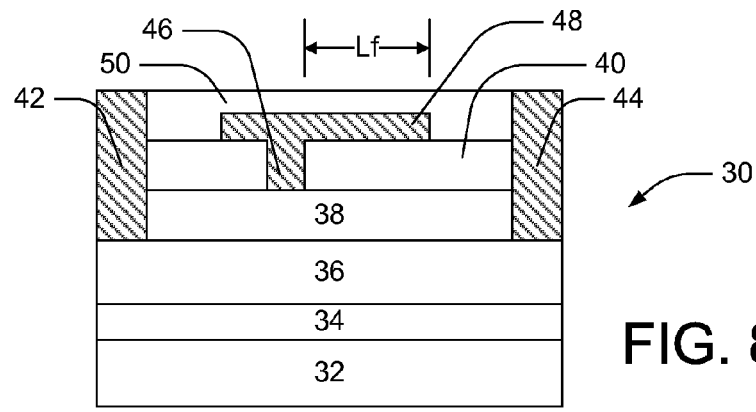
FIG. 8 is a schematic cross-section of a unit cell of a nitride-based HEMT (High Electron Mobility Transistor) device.

An embodiment of the invention is illustrated in FIG. 8, which is a schematic cross-section of a unit cell 30 of a nitride-based HEMT device. Specifically, the device 30 includes a substrate 32, which may comprise silicon carbide, sapphire, spinel, ZnO, silicon or any other material capable of supporting growth of Group III-nitride materials. An $Al_zGa_{1-z}N$ ($0<=z<=1$) nucleation layer 34 is grown on the substrate 32 via an epitaxial crystal growth method, such as MOCVD (Metalorganic Chemical Vapor Deposition), HVPE (Hydride Vapor Phase Epitaxy) or MBE (Molecular Beam Epitaxy). The formation of nucleation layer 34 may depend on the material of substrate 32. For example, methods of forming nucleation layer 34 on various substrates are taught in [4] and [5]. Methods of forming nucleation layers on silicon carbide substrates are disclosed in [6], [7] and [8].

A high resistivity Group III-nitride channel layer 36 is formed on the nucleation layer 34. Channel layer 36 may comprise $Al_xGa_yIn_{(1-x-y)}N$ ($0<=x<=1$, $0<=y<=1$, $x+y<=1$). Next, an $Al_xGa_{1-x}N$ ($0<=x<=1$) barrier layer 38 is formed on the channel layer 36. Each of the channel layer 36 and barrier layer 38 may comprise sub-layers that may comprise doped or undoped layers of Group III-nitride materials. Exemplary structures are illustrated in [3], [9], [10], [11] and [12]. Other nitride-based HEMT structures are illustrated in [13] and [14].

In the embodiment illustrated in FIG. 8, a Group III-nitride semiconductor spacer layer 40 is grown on the $Al_xGa_{1-x}N$ barrier layer 28. Spacer layer 40 may have a uniform or graded composition. Spacer layer 40 may be undoped and/or may be designed to be fully depleted as grown.

Source 42 and drain 44 electrodes are formed making ohmic contacts through the barrier layer 38 such that an electric current flows between the source and drain electrodes 42, 44 via a two-dimensional electron gas (2DEG) induced at the heterointerface between the channel layer 36 and barrier layer 38 when a gate electrode 46 is biased at an appropriate level. The formation of source and drain electrodes 42, 44 is described in detail in the patents and publications referenced above.

The spacer layer 40 may be etched and the gate electrode 46 deposited such that the bottom of the gate electrode 46 is on the surface of barrier layer 38. The metal forming the gate electrode 46 may be patterned to extend across spacer layer 40 so that the top of the gate 46 forms a field plate structure 48 extending a distance Lf away from the edge of gate 46 towards drain 44. Stated differently, the part of the gate 46 metal resting on the spacer layer 40 forms an epitaxial field plate 48. Finally, the structure is covered with a dielectric passivation layer 50 such as silicon nitride. Methods of forming the dielectric passivation 50 are described in detail in the patents and publications referenced above.

Figure 9:
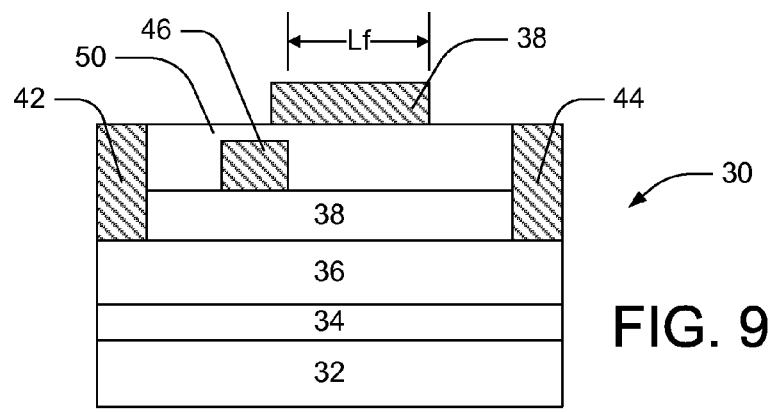
FIG. 9 is a schematic cross-section of a unit cell of a nitride-based HEMT device having a different configuration from the device illustrated in FIG. 8.

Other embodiments of the invention are illustrated in FIG. 9, which is a schematic cross-section of a unit cell 30 of a nitride-based HEMT device having a different configuration from the device illustrated in FIG. 8. The substrate 32, nucleation layer 34, channel layer 36 and barrier layer 38 in the device 30 illustrated in FIG. 9 are similar to the corresponding layers illustrated in FIG. 8. In some embodiments, the substrate 32 comprises semi-insulating 4H—SiC commercially available from Cree, Inc. of Durham, N.C., the nucleation layer 34 is formed of AlN, and the channel layer 36 comprises a 2 μm thick layer of GaN:Fe, while barrier layer 38 comprises 0.8 nm of AlN and 22.5 nm of $Al_xGa_{1-x}N$, wherein x=0.195, as measured by PL (photoluminescence).

The gate electrode 46 is formed after formation of barrier layer 38 and passivation layer 50 is deposited on the device. A field plate 48 is then formed on the passivation layer 50 overlapping the gate 46 and extending a distance Lf in the gate-drain region. In the embodiment illustrated in FIG. 9, passivation layer 50 serves as a spacer layer for the field plate 48. The overlap of the field plate 48 above the gate 46 and the amount of extension in the gate-drain region may be varied for optimum results. Field plate 48 and gate 46 may be electrically connected with a via or other connection (not shown).

In some embodiments, the field plate 48 may extend a distance Lf of 0.2 to 1 μm. In some embodiments, the field plate 48 may extend a distance Lf of 0.5 to 0.9 μm. In preferred embodiments, the field plate 48 may extend a distance Lf of 0.7 μm.

A GaN-based HEMT structure in accordance with the embodiment of FIG. 9 was constructed and tested. The device achieved a power density of 32 W/mm with 55% Power Added Efficiency (PAE) operating at 120 V and 4 GHz.

Figure 10:
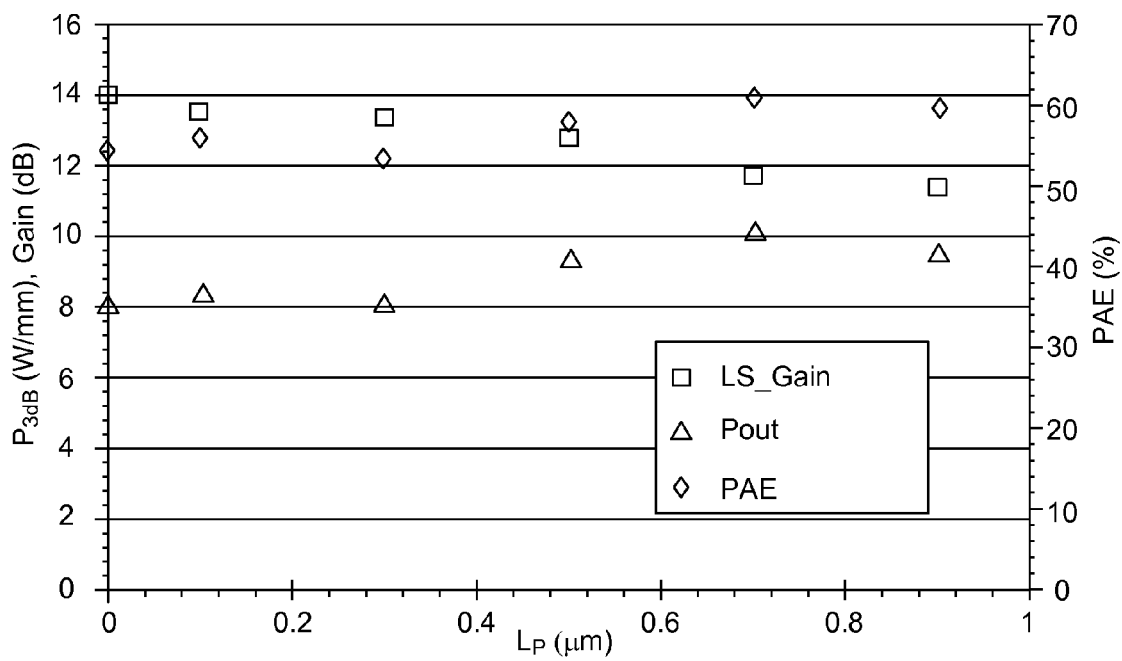
FIG. 10 is a graph that illustrates the effect of field plate distance on device performance.

The effect of field plate distance (Lf) on device performance was tested. Devices were fabricated generally in accordance with the embodiment of FIG. 9 except that the field plate length Lf was varied from a distance of 0 to 0.9 μm. The PAE of the resulting devices was then measured. As illustrated in FIG. 10, the PAE showed improvement once the field plate length was extended to 0.5 μm, with an optimum length of about 0.7 μm. However, the optimum length may depend on the specific device design as well as operating voltage and frequency.

REFERENCES

The following references are incorporated by reference herein:

[1] K Asano et al. "Novel High Power AlGaAs/GaAs HFET with a Field-Modulating Plate Operated at 35V Drain Voltage," IEDM Conference, 1998, pp. 59-62.
[2] Y. Ando et al. "10-W/mm AlGaN—GaN HFET With a Field Modulating Plate," IEEE Electron Device Letters, Vol. 24, No. 5, May 2003, pp. 289-291.
[3] U.S. Pat. No. 6,586,781, issued Jul. 1, 2003, to Wu, et al., entitled "Group III nitride based FETs and HEMTs with reduced trapping and method for producing the same."
[4] U.S. Pat. No. 5,290,393, issued Mar. 1, 1994, to Nakamura, entitled "Crystal growth method for gallium nitride-based compound semiconductor."
[5] U.S. Pat. No. 5,686,738, issued Nov. 11, 1997, to Moustakas, entitled "Highly insulating monocrystalline gallium nitride thin films."
[6] U.S. Pat. No. 5,393,993, issued Feb. 28, 1995, to Edmond, et al., entitled "Buffer structure between silicon carbide and gallium nitride and resulting semiconductor devices."
[7] U.S. Pat. No. 5,523,589, issued Jun. 4, 1996, to Edmond, et al., entitled "Vertical geometry light emitting diode with group III nitride active layer and extended lifetime."
[8] U.S. Pat. No. 5,739,554, issued Apr. 14, 1998, to Edmond, et al., entitled "Double heterojunction light emitting diode with gallium nitride active layer."
[9] U.S. Pat. No. 6,316,793, issued Nov. 13, 2001, to Sheppard, et al., entitled "Nitride based transistors on semi-insulating silicon carbide substrates."
[10] U.S. Pat. No. 6,548,333, issued Apr. 15, 2003, to Smith, entitled "Aluminum gallium nitride/gallium nitride high electron mobility transistors having a gate contact on a gallium nitride based cap segment."
[11] U.S. Patent Application Publication No. 2002/0167023, published Nov. 14, 2002, by Chavarkar, Prashant; et al., entitled "Group-III nitride based high electron mobility transistor (HEMT) with barrier/spacer layer."
[12] U.S. Patent Application Publication No. 2003/0020092, published Jan. 30, 2003, by Parikh, Primit, et al., entitled "Insulating gate AlGaN/GaN HEMT."
[13] U.S. Pat. No. 5,192,987, issued Mar. 9, 1993, to Khan, et al., entitled "High electron mobility transistor with $GaN/Al_xGa_{1-x}N$ heterojunctions."
[14] U.S. Pat. No. 5,296,395, issued Mar. 22, 1994, to Khan, et al., entitled "Method of making a high electron mobility transistor."
[15] Y.-F. Wu, A. Saxler, M. Moore, R. P. Smith, S. Sheppard, P. M. Chavarkar, T. Wisleder, U. K. Mishra, P. Parikh, "30 W/mm GaN HEMTs by field plate optimization", IEEE EDL, Vol. 25, No. 3, pp. 117-119, March 2004.
[16] S. Karmalkar, U. K. Mishra, Very high voltage AlGaN—GaN HEMT using a field plate deposited on a stepped insulator, Solid State Electronics, 45 (2001) 1645-1652.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating one or more gate field plates, comprising:
   providing a dielectric material layer directly on an active region and directly on a gate of a device;
   etching the dielectric material layer; and
   evaporating metal onto the dielectric material layer, after etching the dielectric material layer, to create at least one field plate, wherein:
   (i) none of the dielectric material layer provided on the active region of the device is removed to expose the active region;
   (ii) the at least one field plate is created on the dielectric material layer and at least overlaps the gate above the active region; and
   (iii) the gate is directly on the active region.

2. The method of claim 1, further comprising controlling the field plate's operation, a breakdown voltage of the device, and a radio frequency (RF) performance of the device, by varying one or more parameters comprising field plate offset with respect to the gate and other field plates, a number of the at least one field plate, the at least one field plate's length, the dielectric material layer's thickness, and the electrical connection between the at least one field plate and the gate.

3. The method of claim 1, further comprising creating multiple connections using multiple gate field plates in order to reduce gate resistance.

4. The method of claim 1, wherein the field plate is positioned in a gate drain access region, thereby providing a capability of modulating the active region, resulting in a decrease of surface traps effect that prevent proper device operation under large radio frequency (RF) signals.

5. The method of claim 1, further comprising preventing any exposure of the surface of the active region to the dry or wet etch process that may induce damage in the device.

6. The method of claim 1, further comprising depositing a parallel gate contact on top of the dielectric material layer by properly adjusting the dielectric material layer's thickness, in order to significantly reduce gate resistance, wherein:
the parallel gate contact is formed by electrically connecting the gate and the at least one field plate on extrinsic regions, and
the dielectric material layer's thickness is selected to ensure one or more parasitic capacitances added by the at least one field plate are reduced compared to those of an intrinsic device.

7. The method of claim 1, wherein the device is a field effect transistor that includes source ohmic contacts and drain ohmic contacts, gate contact and an active region.

8. The method of claim 1, wherein:
(1) the providing step comprises depositing or growing the dielectric material layer on intrinsic and extrinsic regions of the device;
(2) the etching step comprises patterning the dielectric material layer, so that the dielectric material layer remains principally on the active region of the device; and
(3) the evaporating step comprises creating the at least one field plate on the patterned dielectric material layer, wherein gate and field plate contacts are electrically connected at least at one side of the device's extrinsic region, providing a low resistance connection therebetween.

9. The method of claim 8, further comprising a plurality of the at least one field plate, and controlling the dielectric material layer's thickness between the field plates in order to achieve proper radio frequency (RF) operation of the device.

10. The method of claim 8, wherein the patterning step (2) comprises patterning the dielectric material layer by a dry or wet etch process or by a lift-off process.

11. The method of claim 8, wherein the creating a field plate step (3) further comprises evaporating a field plate on the patterned dielectric material layer before the gate and field plate contacts are electrically shorted.

12. The method of claim 8, wherein steps (1)-(3) are repeated to create a plurality of the field plates.

13. The method of claim 8, wherein the field plate has a resistance Rf that is equivalent to a gate resistance Rg.

14. The method of claim 8, wherein the at least one field plate is connected to both sides of the device active region.

15. The method of claim 8, further comprising creating multiple connections between the gate and the at least one field plate to decrease gate resistance.

16. The method of claim 15, wherein the creating the multiple connections step further comprises etching a small portion of the active region prior to deposition of the gate to create the multiple connections between the gate and the at least one field plate.

17. The method of claim 15, further comprising spacing between a plurality of the active regions to engineer a thermal impedance of the device.

18. The method of claim 15, wherein the device comprises a larger periphery device with a reduced number of air bridges as compared to a device without the multiple connections, without the dielectric material layer remaining principally on the active region, and without the electrically shorted gate and at least one field plate.

19. The method of claim 15, wherein the creating multiple connections step further comprises creating the multiple connections without a T-shape in order to lower gate resistance.

20. The method of claim 15, further comprising a plurality of the at least one field plate, wherein the creating multiple connections step further comprises creating the multiple connections using parallel field plates.

21. The method of claim 20, wherein the creating the field plate step further comprises the step of creating the field plate covering the gate source access region in order to modulate source access resistance for improving device linearity performance.

22. The method of claim 1, wherein a gate and the at least one field plate are only electrically connected at one or more sides of an extrinsic region of the device, and gate resistance is reduced by controlling a width at which a connection between a gate and the field plates occurs.

23. The method of claim 1, wherein the device is a group III-nitride field effect transistor and the active region comprises a barrier layer on a channel layer such that a two dimensional electron gas is confined in the channel layer.

24. The method of claim 1, further comprising evaporating the metal on the etched dielectric, wherein the at least one field plate is electrically shorted to and overlaps with a contact to the gate at least outside a lateral boundary of the active region.

25. The method of claim 24, wherein the gate is directly on a semiconductor that confines a conducting channel in the transistor.

26. A method of fabricating a device, comprising:
(a) providing a dielectric material directly on a barrier layer of an active region of a device, the active region comprising the barrier layer directly on a channel layer;
(b) providing an opening in the dielectric material for depositing a gate on the device, wherein the barrier layer is exposed in the opening; and
(c) providing metal onto the dielectric material to create at least one field plate;
wherein no material provided on the barrier layer, after formation of the barrier layer, is removed to expose the barrier layer except at the opening for the gate and in source and drain contact regions of the barrier layer, the material comprising the dielectric material, or semiconductor material, or the dielectric material and the semiconductor material.

27. The method of claim 26, further comprising a plurality of the at least one field plate, and controlling the dielectric material's thickness between the field plates in order to achieve proper radio frequency (RF) operation of the device.

28. The method of claim 26, wherein steps (a)-(b) are repeated to create a plurality of the at least one field plate.

29. The method of claim 26, wherein the device is a transistor, the gate is directly on the barrier layer, and the barrier layer is a structure that confines a conductive channel of the transistor.

30. The method of claim 26, wherein the gate and the at least one field plate of the device are electrically connected and overlap with each other at least outside the active region, as viewed from a top of the device.

31. The method of claim 23, wherein the device is a group III-nitride field effect transistor.

32. The method of claim 26, wherein an amount of the overlap between the field plate and the gate, an amount of extension of the field plate across the dielectric material, a composition of the dielectric material, and a thickness of the dielectric material are controlled to improve frequency performance of the transistor.

33. A method of fabricating a gated device, comprising:
providing an undoped semiconductor spacer layer on an active region of a device, the active region comprising a barrier layer on a channel layer;
providing a source contact on the barrier layer and a drain contact on the barrier layer;
providing an opening in the semiconductor spacer layer for a gate;
depositing a gate in the opening; and
creating a field plate directly on the semiconductor spacer layer;
wherein:
none of the semiconductor spacer layer provided on the barrier layer of the device is removed to expose the barrier layer-except at the opening for the gate and in source and drain contact regions of the barrier layer,
the source contact and the drain contact extend through the barrier layer to the channel layer, and
the field plate is electrically connected to the gate.

34. The method of claim 33, wherein:
the device is a group III-nitride field effect transistor, and
the semiconductor spacer layer has a doping level that is not selected to impact the device's performance, the device's performance including frequency performance.

35. The method of claim 33, wherein a two dimensional electron gas is confined in the channel layer.

36. The method of claim 33, wherein the spacer layer is not a barrier layer.

* * * * *